United States Patent [19]

Shimosaka

[11] Patent Number: 4,977,565
[45] Date of Patent: Dec. 11, 1990

[54] METHOD AND APPARATUS FOR STABILIZING OSCILLATION FREQUENCY SEPARATION AMONG PLURAL LASER DEVICES

[75] Inventor: Naoki Shimosaka, Tokyo, Japan

[73] Assignee: NEC Corporation, Tokyo, Japan

[21] Appl. No.: 382,469

[22] Filed: Jul. 20, 1989

[30] Foreign Application Priority Data

Jul. 20, 1988 [JP] Japan .................................. 63-182216

[51] Int. Cl.$^5$ .............................................. H01S 3/13
[52] U.S. Cl. ........................................ 372/32; 372/38; 372/28
[58] Field of Search ...................... 372/32, 28, 29, 33, 372/26, 9, 24, 38

[56] References Cited

U.S. PATENT DOCUMENTS 4,835,782 5/1989 Kaede et al. ........................ 372/32

OTHER PUBLICATIONS

"Part 2", National Conference Record, 1986, The Institute of Electronics and Communication Engineers of Japan, p. 2-204.
"Technical Digest", vol. III, 5th International Conference on Integrated Optics and Optical Fiber Communication; Oct. 1-4, 1985, pp. 61-64.
Electronics Letters, Apr. 9, 1987, vol. 23, No. 8, pp. 403-405.
12th European Conference on Optical Communication, Technical Digest, vol. 1, Sep. 22/25, 1986, pp. 29-32.

Primary Examiner—Léon Scott, Jr.
Attorney, Agent, or Firm—Sughrue, Mion, Zinn, Macpeak & Seas

[57] ABSTRACT

Reference signals having a predetermined frequency interval are produced in use of a wavelength tunable laser device and an optical resonator. Plural laser devices are controlled to radiate light outputs with oscillation frequency separation. The light outputs and a frequency swept light output of the wavelength tunable laser device are combined, and then converted to beat signals. The reference signals and the beat signals are compared to detect time differences of signal occurrance timings. The plural laser devices are driven with the oscillation frequency separation, such that the time differences become a predetermined value. Where a beat pulse is not produced due to a fault in at least one laser device among the plural laser devices, a dummy pulse is produced to produce signal of the time differences. The laser device of the fault may be driven with an injecting current varying in a predetermined range to produce a beat pulse.

3 Claims, 13 Drawing Sheets

201 ACTIVE REGION
202 PC REGION
203 DBR REGION

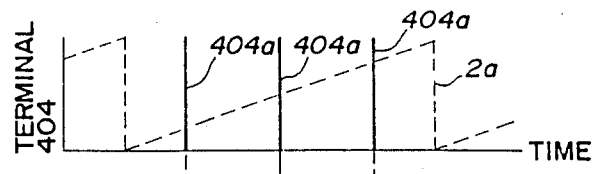
FIG. 7A
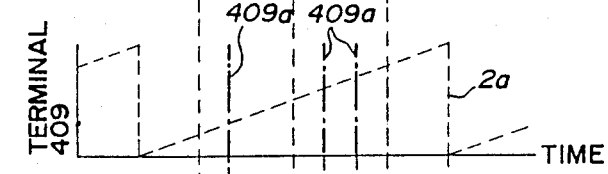
FIG. 7B
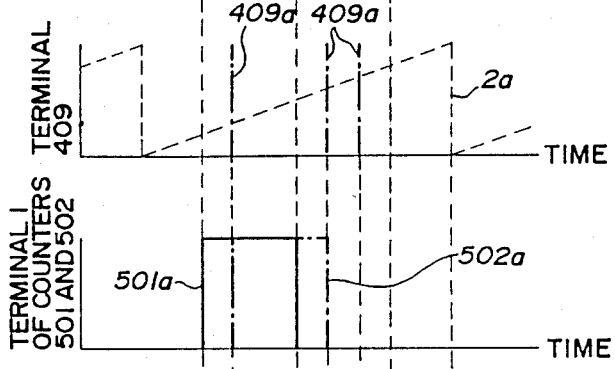
FIG. 7C
FIG. 7D
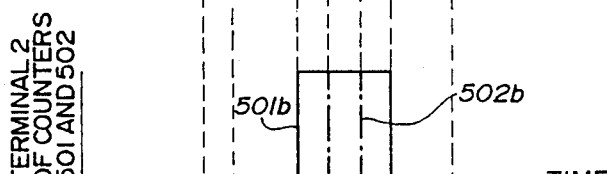
FIG. 7E
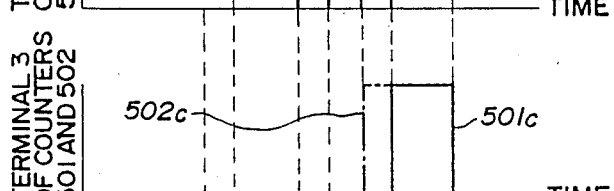
FIG. 7F
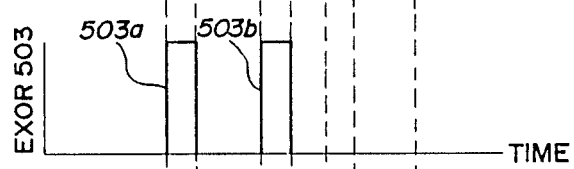
FIG. 7G
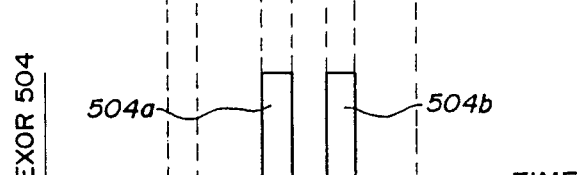
FIG. 7H
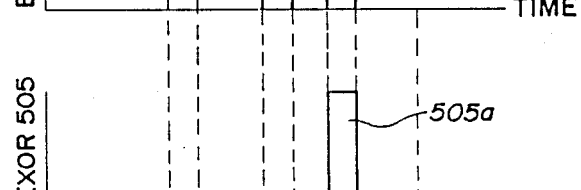

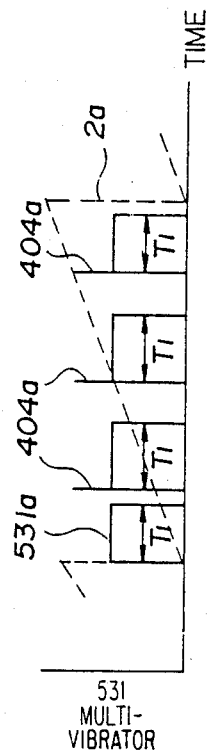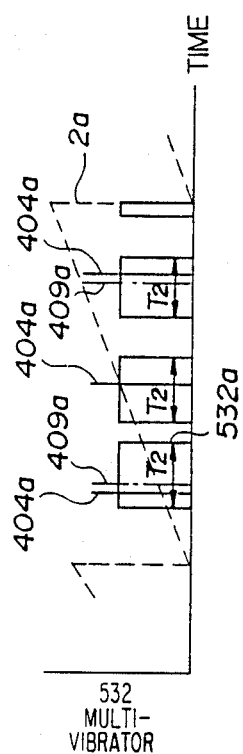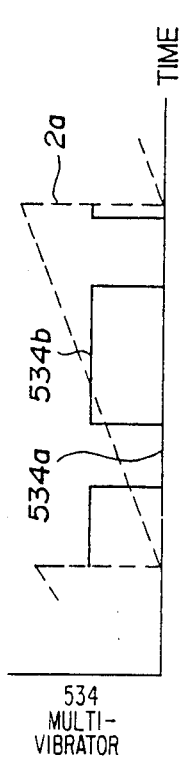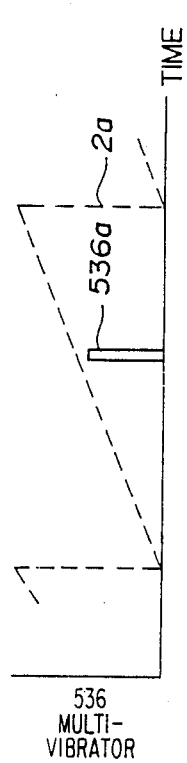

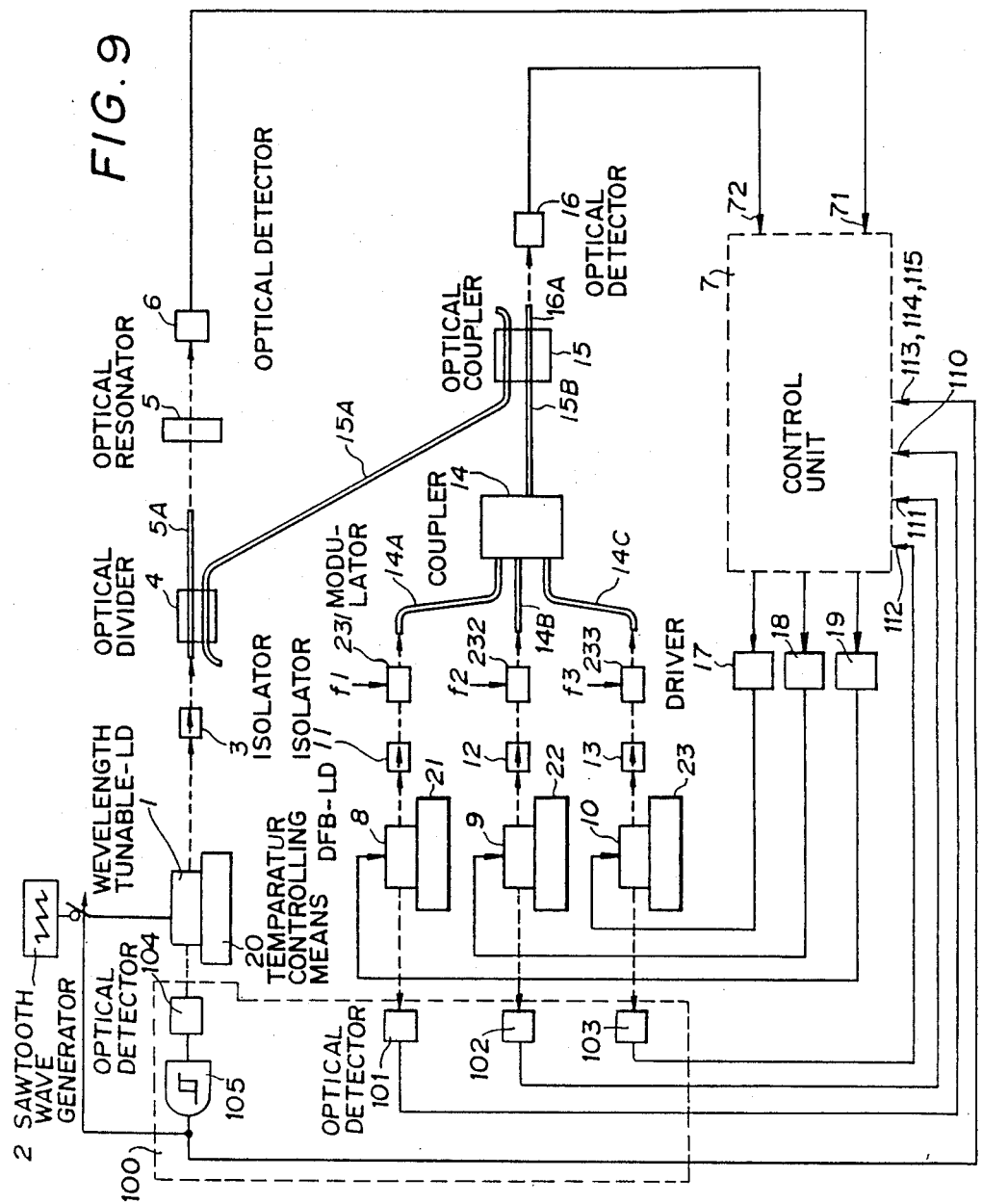

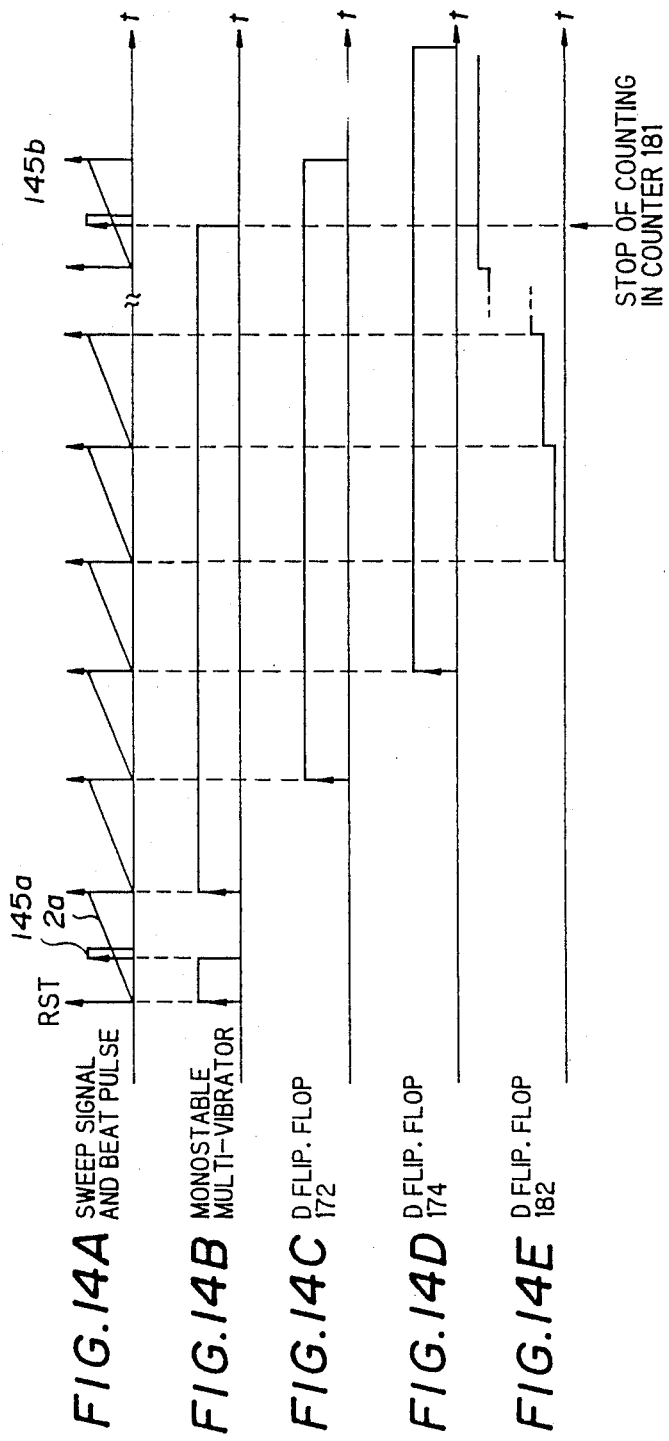

METHOD AND APPARATUS FOR STABILIZING OSCILLATION FREQUENCY SEPARATION AMONG PLURAL LASER DEVICES

FIELD OF THE INVENTION

The invention relates to method and apparatus for stabilizing oscillation frequency separation among plural laser devices, and more particularly to method and apparatus for stabilizing oscillation frequency separation among plural laser devices applied to an optical communication in which light signals are transmitted in an optical frequency division multiplexing with a high density of frequencies to increase a transmission capacity.

BACKGROUND OF THE INVENTION

A conventional method for stabilizing oscillation frequency separation among plural laser devices has been described on page 2-204 of "Part 2, National Conference Record, 1986, The Institute of Electronics and Communication Engineers of Japan". In the method for stabilizing oscillation frequency separation among plural laser devices, an oscillation frequency of a laser device selected from the plural laser devices is stabilized to be based on a resonant frequency of a Fabry-Perot etalon. Oscillation frequencies of the remaining laser devices which are observed through a scanning Fabry-Perot optical resonator are stabilized to be provided with a predetermined separation based on the oscillation frequency of the selected laser device.

A further conventional method for stabilizing oscillation frequency separation among plural laser devices has been described on pages 61 to 64 of "Technical digest, Vol.III, 5th International Conference on Integrated Optics and Optical Fiber Communication, Oct. 1 to 4, 1985". In the method for stabilizing oscillation frequency separation among plural laser devices, the plural laser devices in which an oscillation frequency of a selected laser device is stabilized are to radiate light outputs with respective frequencies, while an oscillation frequency sweep laser device is driven to radiate a frequency swept light output in accordance with a sawtooth sweep signal. The light outputs radiated from the plural laser devices are coupled with the frequency swept light output radiated from the oscillation frequency sweep laser device to produce beat signals which are then converted to a train of pulse signals. The plural laser devices are controlled, such that generation times of the pulse signals are of respective predetermined separations as compared to a generation time of a pulse signal which is produced on the basis of light output radiated from the selected laser device having a stabilized oscillation frequency. As a result, the plural laser devices are stabilized to radiate light outputs among which oscillation frequencies are maintained to have a predetermined separation.

A still further conventional method for stabilizing oscillation frequency separation among plural laser devices has been described in "The Technical Research Report, Vol. 87, CS87-96, 1987, The Institute of Electronics, Information and Communication Engineers of Japan." In the method for stabilizing oscillation frequency separation among plural laser devices, an optical resonator is introduced to a control system of the second method as described above in which the optical resonator is used for a reference of the oscillation frequency separation.

However, the following disadvantages are observed in the first to third methods as described above. In the first method, the Fabry-Perot optical resonator is used for realizing the oscillation frequency separation. As a result, the number of laser devices which are simultaneously controlled in the oscillation frequency separation is limited to approximately 10 to 20, because the number depends on a finesse of the Fabry-Perot resonator. Further, the mechanical stability is low, because the mechanical sweeping operation is carried out. In the second method, a reference of the oscillation frequency separation must be brought into a system for performing this method, because the reference of the oscillation frequency separation is not provided in the system. Further, the reference of the oscillation frequency separation is determined by a relation between the pulse generation times obtained from the beat signals and voltages applied to the laser devices at the times, which is based on a relation of a swept oscillation frequency changed relative to a voltage applied to the oscillation frequency sweep type laser device, so that the oscillation frequency separation initially set is not maintained, where the relation changes due to the secular variation of the laser devices, and a target voltage must be set again in a laser device which is newly included in place of a laser device of a fault. In the third method, it is inevitable that an oscillation frequency deviates even in a laser device operating correctly, where any fault occurs in some of the laser devices in which the oscillation frequency separation is controlled, or in the laser device in which an oscillation frequency is swept, although the disadvantages of the first and second methods are overcome.

SUMMARY OF THE INVENTION

Accordingly, it is a first object of the invention to provide method and apparatus for stabilizing oscillation frequency separation among plural laser devices in which the number of the laser devices to be controlled in the oscillation frequencies separation is not limited.

It is a second object of the invention to provide method and apparatus for stabilizing oscillation frequency separation among plural laser devices in which the high stability is maintained for a long time.

It is a third object of the invention to provide method and apparatus for stabilizing oscillation frequency separation among plural laser devices in which the oscillation separation initially set is maintained despite the secular variation of a laser device.

It is a fourth object of the invention to provide method and apparatus for stabilizing oscillation frequency separation among plural laser devices in which oscillation frequencies of laser devices having no fault are kept to be controlled, even if a fault occurs in at least one of the laser devices to be controlled or in an oscillation frequency sweep laser devices.

According to a first feature of the invention, a method for stabilizing oscillation frequency separation among plural laser devices, comprises:

sweeping the oscillation frequency of a reference semiconductor laser device to which an external signal is applied to radiate a light output whose oscillation frequency varies over a range of frequencies;

driving plural semiconductor laser devices to radiate light outputs each at an oscillation frequency in the frequency range of said oscillation frequency sweep of light output from said reference semiconductor laser;

combining the frequency swept light output from said reference semiconductor laser and said light outputs from said plural semiconductor laser devices to produce combined light signals which are then converted to electric signals, a low frequency component of said electric signals being filtered to produce a train of beat pulses corresponding to said oscillation frequencies of said plural semiconductor laser devices;

passing a part of the frequency swept light output from said reference semiconductor laser through an optical resonator having periodic resonant frequencies to produce reference light outputs at said periodic resonant frequencies which are then converted to electric reference pulses, the interval between said periodic resonant frequencies being equal to a predetermined oscillation frequency separation among said plural semiconductor laser devices;

comparing occurrence times of said beat pulses and those of said reference pulses to produce error signals corresponding to the time difference therebetween;

controlling the oscillation frequencies of said plural semiconductor laser devices such that said error signals are approximately equal to a predetermined value;

monitoring the occurrence of each beat pulse of said beat pulses in a predetermined time duration before and after the occurrence of said reference pulses; and producing a dummy beat pulse at the end of said predetermined time duration where no beat pulse is detected in said monitoring of said occrrence of said each beat pulse, said dummy beat pulse being compared with a corresponding reference pulse of said reference pulses to produce said error signal.

According to a second feature of the invention, an apparatus for stabilizing among plural laser devices, comprises:

a reference semiconductor laser device to which an oscillation frequency sweep signal is applied over a range of frequencies;

plural semiconductor laser devices radiating light outputs each at an oscillation frequency in the frequency range of said oscillation frequency sweep of light output from said reference semiconductor laser device;

an optical divider for dividing the light output of said reference semiconductor laser device into at least two light outputs;

a first optical coupler for combining light outputs from said plural laser device;

a second optical coupler for combining one of said at least two light outputs and the light outputs combined in said first optical coupler;

an optical resonator through which the other one of said at least two light outputs is passed to produce transmission light outputs whose intensity levels correspond to resonant frequency peaks, so that reference light outputs are supplied therefrom;

means for converting said reference light outputs to electric reference pulses;

means for converting the combined output light obtained in said second optical coupler to an electric signal;

a low-pass filter through which a low frequency component of said electric signal is passed to produce beat pulses corresponding to said oscillation frequencies of said plural laser devices;

means for producing error signals in accordance with the difference of the occurrence times between said reference pulses and said beat pulses;

means for controlling said plural laser devices to be driven in accordance with said error signals, such that said error signals become a predetermined value;

a beat pulse monitoring circuit for monitoring the occurrence of each beat pulse of said beat pulses in a predetermined time duration before and after the occurrence of said reference pulses; and a dummy beat pulse producing circuit for producing a dummy beat pulse at the end of said predetermined time duration where no beat pulse is detected by said beat pulse monitoring circuit;

wherein said means for controlling controls said means for producing to produce said error signal in accordance with the comparison between said dummy beat pulse and a corresponding reference pulse of said reference pulses.

According to a third feature of the invention, an apparatus for stabilizing oscillation frequency separation among plural laser devices, comprises:

a reference semiconductor laser device to which an oscillation frequency sweep signal is applied over a range of frequencies;

plural semiconductor laser devices radiating light outputs each at an oscillation frequency in the frequency range of said oscillation frequency sweep of light output from said reference semiconductor laser device;

an optical divider for dividing the light output of said reference semiconductor laser device into at least two light outputs;

plural optical modulators for modulating the light outputs from said plural laser devices with different modulating frequencies;

a first optical coupler for combining the modulated light outputs from said plural optical modulator;

a second optical coupler for combining one of said at least two light outputs and the modulated light outputs combined in said first optical coupler;

an optical resonator through which the other one of said at least two light outputs is passed to produce transmission light outputs whose intensity levels correspond to resonant frequency peaks, so that reference light outputs are supplied therefrom;

means for converting the combined output light obtained in said second optical coupler to an electric signal;

a low-pass filter through which a low frequency component of said electric signal is passed to produce beat pulses corresponding to said oscillation frequencies of said plural laser devices;

means for producing error signals in accordance with the difference of the occurrence times between said reference pulses and said beat pulses;

means for monitoring light output powers of said reference semiconductor laser device and said plural laser devices;

a beat pulse monitoring circuit for receiving the combined light output of said second optical coupler and monitoring whether or not beat pulses corresponding to the different modulating frequencies are detected in said combined light output;

means for varying an injection current for at least one laser device of said plural laser devices in a predetermined current range, the light output power of said at least one laser device being monitored to be greater than a first predetermined power value by said means for monitoring, where a beat pulse corresponding to said at least one laser device is not detected by said beat pulse monitoring circuit;

means for shutting off an injection current for at least one laser device of said plural laser devices, where the light output power of said at least one laser device being monitored to be less than a second predetermined power value, and a beat pulse corresponding to said at least one laser device is not detected by said beat pulse monitoring circuit, despite the variation of the injection current in the predetermined current range; and means for controlling said plural laser devices to be driven in accordance with said error signals, such that said error signals become a predetermined value, where the light output powers of said plural laser devices are all greater than the first predetermined power value, and the beat pulses corresponding to the different modulating frequencies are all detected, and controlling said plural laser devices to be driven with injection currents which are equal to values at the final moment at which said reference semiconductor laser device is driven to radiate a light output power greater than a third predetermined power value, where the light output power of said reference semiconductor laser device becomes lower than the third predetermined power value.

BRIEF DESCRIPTION OF THE DRAWINGS

The invention will be explained in more detail in conjunction with appended drawings wherein, FIGS. 7A to 7M and FIGS. 8A to 8D are timing charts showing an operation in the first embodiment, FIG. 9 is a block diagram showing a second embodiment according to the invention, FIGS. 13A to 13F and FIGS. 14A to 14E are timing charts showing an operation in the second embodiment.

DESCRIPTION OF PREFERRED EMBODIMENTS

Figure 1:
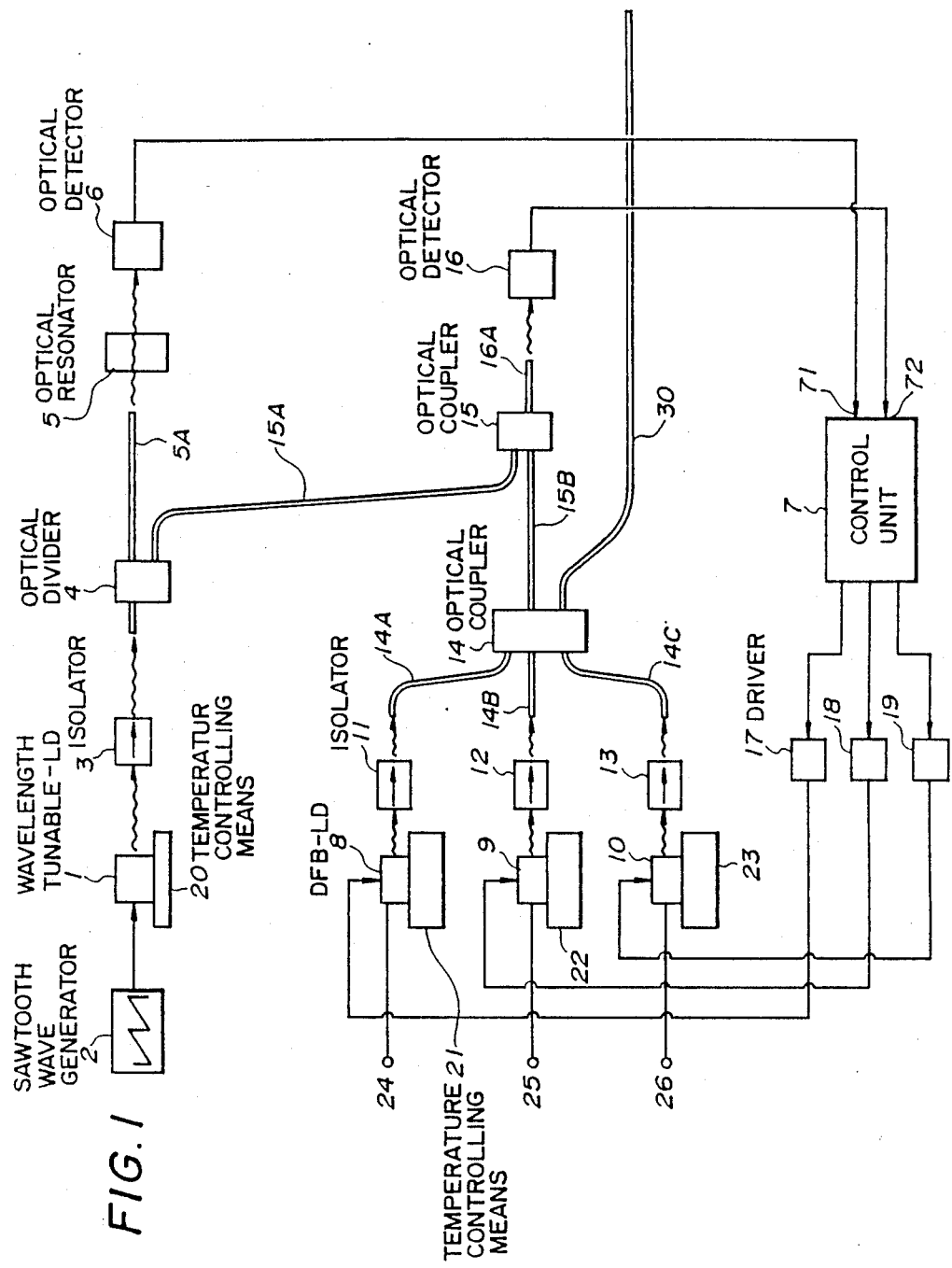
FIG. 1 is a block diagram showing a first embodiment according to the invention.

FIG. 1 shows an apparatus for stabilizing oscillation frequency separation among plural laser devices in the first embodiment according to the invention which comprises a distributed Bragg reflector type of a 1.55 μm band wavelength tunable Double Channeled-Planar Buried Heterostructure semiconductor laser device 1 (defined as "a wavelength tunable laser" hereinafter), a sawtooth wave generator 2 from which a sawtooth wave current is injected into a phase control (PC) region and a DBR region of the wavelength tunable laser device 1, an isolator 3 through which a light output of the wavelength tunable laser device 1 is passed, an optical divider 4 for dividing the light output into two light outputs which are propagated through optical fibers 5A and 15A, a Fabry-Perot optical resonator 5 having three resonant frequencies (equal to the number of below described laser devices 8, 9 and 10) through which a light output supplied from the optical fiber 5A is passed to produce three light pulses in one period of the sawtooth wave of the generator 2 based on the three resonant frequencies, a first optical detector 6 for converting the three light pulses supplied from the optical resonator 5 to three electric signals, the 1.55 μm band distributed feedback type laser devices 8, 9 and 10 with modulation signal input terminals 24, 25 and 26 (defined as "DFB-LD" hereinafter) among which oscillation frequency separation is stabilized and each being modulated in the frequency shift keying with a modulation rate of 400 Mb/S and a modulation index of 2.5, optical isolators 11, 12 and 13 through which light outputs of the DFB-LDs 8, 9 and 10 are passed, an optical coupler 14 for combining the light outputs propagated through the optical fibers 14A, 14B and 14C and for dividing the light outputs thus combined into two light outputs which are propagated through an optical fiber 15B and an optical fiber transmission line 30, a second optical coupler 15 for combining the light outputs propagated through the optical fibers 15A and 15B, a second optical detector 16 for converting the light output thus combined in the second optical coupler 15 and propagated through an optical fiber 16 to an electric signal, a control unit 7 for producing error signals in accordance with the electric signals received at input terminals 71 and 72, laser device driving means 17, 18 and 19 for driving the DFB-LDs 8,9 and 10 to stabilize the oscillation frequency separation, and temperature controlling means 20,21,22 and 23 on which the wavelength tunable laser device 1, and the DFB-LDs 8,9 and 10 are mounted, respectively.

Figure 2:
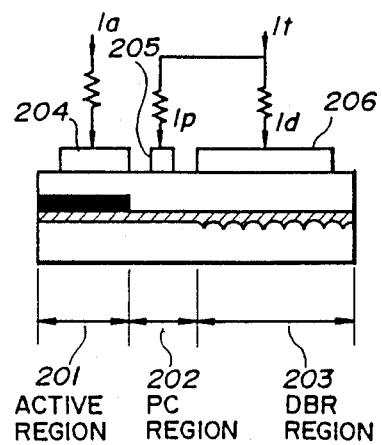
FIG. 2 is an explanatory view showing a wavelength tunable laser device used in the first embodiment.

The wavelength tunable laser device 1 has been described in detail on pages 403 to 405 of "Electronics letters, 9th April 1987, vol, 23, No. 8, and on pages 149 to 161 of "Nikkei Electronics, June 15, 1987" in the title "Varying a wavelength of a semiconductor laser device." As shown in FIG. 2, the wavelength tunable laser device 1 comprises an active region 201, a PC (phase control) region 202, and a DBR (distributed Bragg reflector) region 203 into which currents $I_a$, $I_p$ and $I_d$ are injected through respective electrodes 204, 205 and 206. The current $I_a$ injected into the active region 201 is mainly a current for oscillating the wavelength tunable laser device 1, while the currents $I_p$ and $I_d$ (divided from a total current $I_t$ dependent on respective resistance values) are mainly currents for tuning an oscillation wavelength.

The Fabey-Perot optical resonator 5 has been described in detail in Chapter 4 of "Optical electronics, 1985, authored by Ammon Yariv" published by Halt, Rinehart and Winston Inc. In the embodiment, etalon plate made of quartz glass and having a refractive index of 1.5, a thickness of 1 cm and a finesse of 30 is used for the optical resonator 5. The finesse is defined by a ratio of an optical resonant frequency separation in regard to a full width at half maximum of an optical pass-band in the center of an optical resonant frequency.

Figure 3:
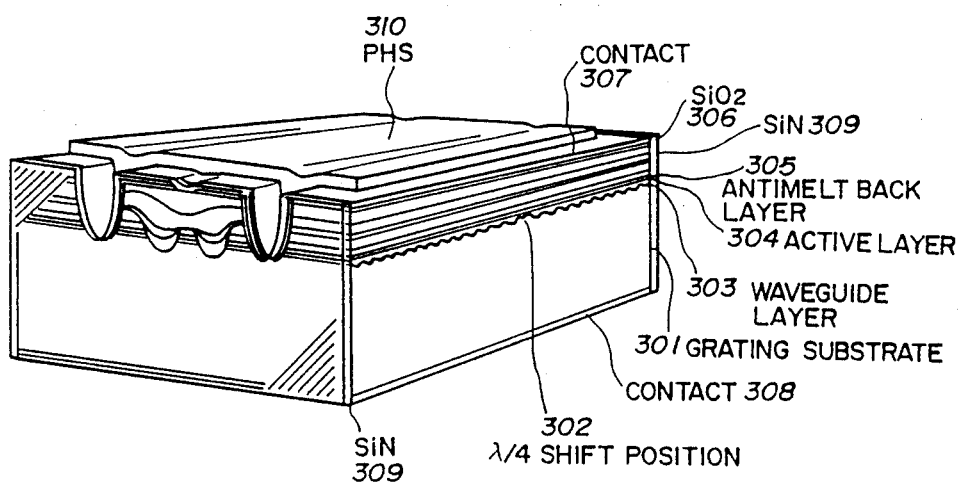
FIG. 3 is a perspective view showing a DFB-LD used in the first embodiment.

The DFB-LDs 8, 9 and 10 have been described in detail in the report entitled "Highly stable single longitudinal mode operation in λ/4 shift 1.5 μm DFB-DC- PBH LDs" on pages 29 to 32 of "12th European Conference on Optical Communication, Technical Digest, Vol. 1, Sept. 22/25, 1986". As shown in FIG. 3, the laser device comprises a first order InP grating substrate 301 including a $\lambda/4$ shift position 302, a waveguide layer 303, and a $SiO_2$ film 306, and further comprises contacts 307 and 308, respectively, provided on the top surface of layers successively grown on the grating substrate 301 and the back surface of the substrate 301, SiN films 309 provided on both side facets thereof, and a PHS layer 310 provided on the contact 307.

Figure 4:
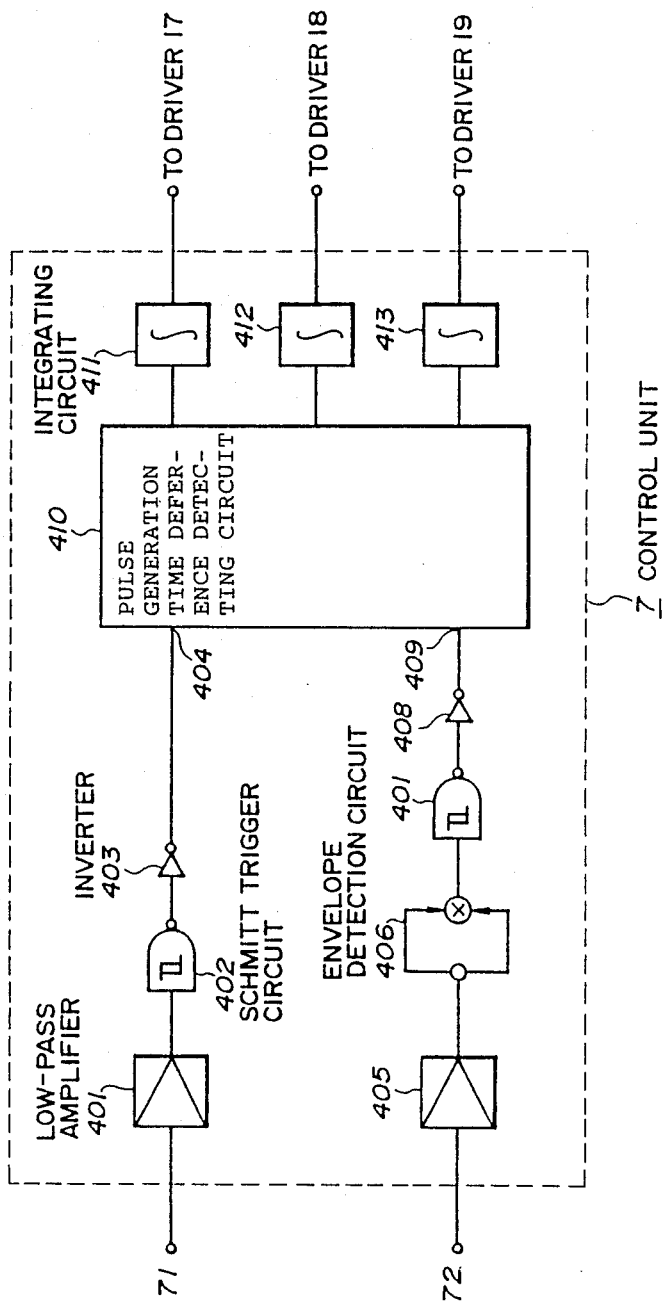
FIG. 4 is a block diagram showing a control unit in the first embodiment.

FIG. 4 shows the control unit 7 which is briefly described in FIG. 1. The control unit 7 comprises a low-pass amplifier 401 for amplifying electric signals of pulses received at the terminal 71 from the optical detector 6, a Schmitt trigger circuit 402 for producing logic signals each having a predetermined logic level in accordance with the outputs of the low-pass amplifier 401, an inverter 403 for inverting the logic signals, a low-pass amplifier 405 with a cut-off frequency of 600 MHz and a function of a low-pass filter for producing electric signals which are defined as "beat pulses" when the frequency difference of the light outputs between the wavelength tunable laser device 1 and the DFB-LDs 8, 9 and 10 is in the range of approximately ±600 MHz, an envelope detector 406 in which the beat pulses are subject to an envelope detection, a Schmitt trigger circuit 407 for producing logic signals in accordance with the outputs of the envelope detector 406, and an inverter 408 for inverting the logic signals, a circuit 410 for detecting the difference of pulse generation times between the reference pulses and the beat pulses in accordance with the logic signals received at terminals 404 and 409, and integrating circuits 411, 412 and 413 for integrating a pulse generation time difference which is detected in the circuit 410. Output signals of the integrating circuits 411, 412 and 413 are supplied to the aforementioned drivers 17, 18 and 19.

Figure 5:
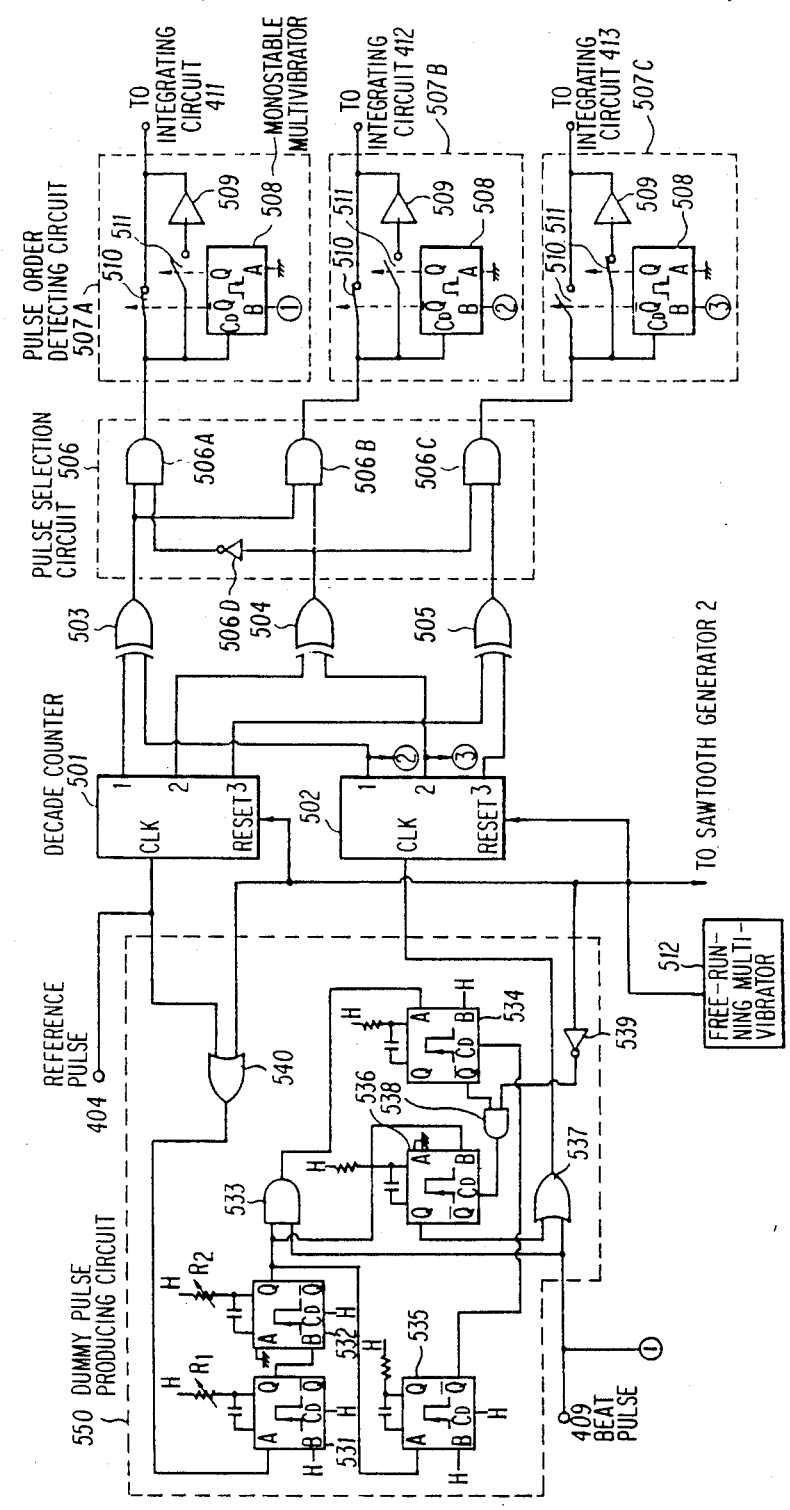
FIG. 5 is a circuit diagram showing a circuit for detecting the difference of pulse producing times in the first embodiment.

FIG. 5 shows the circuit 410 for detecting the pulse generation time difference which comprises a first decade counter 501 having a CLK input terminal for receiving the reference pulses at the terminal 404, and three output terminals 1 to 3, from which a series of square waves each becoming "high" by a reference pulse and "low" by a following reference pulse, except for the output terminal 3 at which a square wave becomes "high" by a third reference pulse and "low" at the end of one period of a sawtooth wave received at a Reset input terminal, are supplied sequentially, a second decade counter 502 which is the same function as the first decade counter 501, except that the beat pulses are received at the terminal 409, exclusive OR circuits 503 to 505 each connected through two input terminals to the corresponding output terminals 1, 2 or 3 of the first and second decade counters 501 and 502, a pulse selection circuit 506 including AND circuits 506A, 506B and 506C and an inverter 506D for selecting the passing of signals from the exclusive OR circuits 503 to 505 to the next stage, first to third pulse order detecting circuits 507A 507B and 507C each detecting a pulse producing order between the reference pulse and the beat pulse, and a free running multi-vibrator 512 connected to the Reset input terminals of the first and second decade counters 501 and 502 and to the sawtooth wave generator 2. Each of the first to third pulse order detecting circuits 507A, 507B and 507C includes a monostable multi-vibrator 508, a polarity reversing circuit 509, and switches 510 and 511 which are turned on and off by outputs of terminals $\overline{Q}$ and Q of the monostable multi-vibrator 508. In the circuit 507A, the multi-vibrator 508 is connected at a terminal $C_D$ to the pulse selection circuit 506 and at a terminal B to the terminal 409. While, in the circuits 507B and 507C, the multi-vibrators 508 are connected at a terminal $C_D$ to the pulse selection circuit 506 and at a terminal B to the output terminals 1 and 2 of the second decade counter 502, respectively. The circuit 410 further comprises a dummy pulse producing circuit 550 including a monostable multi-vibrator 531 for producing a square wave having a width $T_1$ at the rising time of the reference signal and at the starting time of the sweep period, a monostable multi-vibrator 532 for producing a square wave having a width $T_2$ at the falling time of the square wave of the monostable multi-vibrator 531, an AND circuit 533 having two inputs connected to the monostable multi-vibrator 532 and the terminal 409, a monostable multi-vibrator 534 which is driven by an output signal of the AND circuit 533, a monostable multi-vibrator 535 connected to the monostable multi-vibrator 532 and resetting the monostable multi-vibrator 534, a monostable multi-vibrator 536 for producing a square wave at the falling time of the square wave having the width $T_2$, an OR gate 537 having two inputs connected to the monostable multi-vibrator 536 and the terminal 409 and an output connected to the counter 502, an AND circuit 538 having two inputs connected to the monostable multi-vibrator 534 and an inverter 539 and an output connected to the monostable multi-vibrator 536, and an OR circuit 540 having two inputs connected to the terminal 404 and the sawtooth generator 2 and an output connected to the monostable multi-vibrator 531, wherein the widths $T_1$ and $T_2$ of the square waves are varied by variable resistances $R_1$ and $R_2$.

Figure 6:
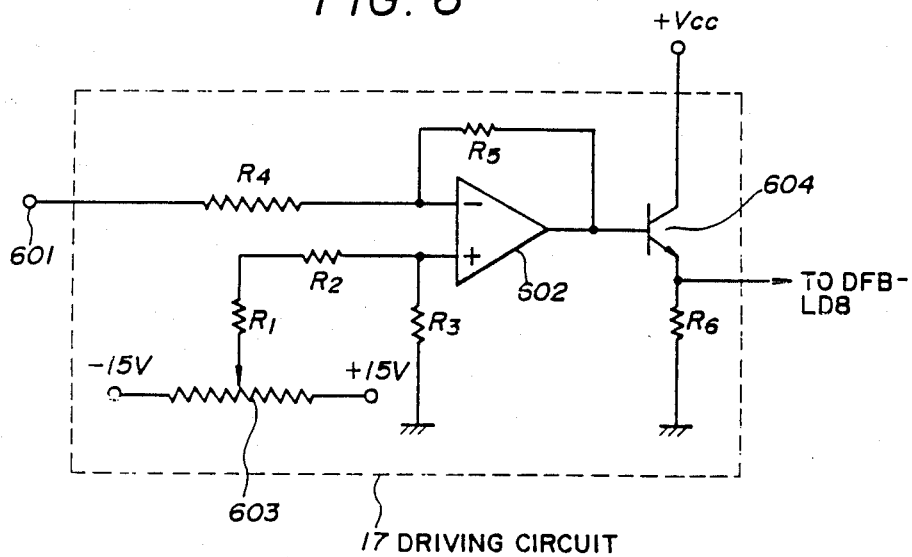
FIG. 6 is a circuit diagram showing a driver for the DFB-LD in the first embodiment.

FIG. 6 shows the laser device driving means 17 for driving the DFB-LD 8 in accordance with the output of the integrating circuit 411 received at a terminal 601. The laser device driving means 17 comprises an operational amplifier 602 having a positive input terminal connected through resistances $R_1$ and $R_2$ to a reference voltage means 603 and through a resistance $R_3$ to the ground and a negative input terminal connected through a resistance $R_4$ to the terminal 601 and to a feedback resistance $R_5$, and driving transistor 604 with a base connected to the operational amplifier 602, a emitter connected to the DFB-LD8 and through a resistance $R_6$ to the ground.

In operation, the wavelength tunable laser device 1 is driven with a current $I_a$ injected into the active region 201 which includes a bias current of 50 mA and a sawtooth wave current 2a (as shown in FIGS. 7A and 7B) having a repetition frequency of 500 Hz and a current range of 0 to 5.4 mA supplied from the sawtooth wave generator 2, and with a current $I_t$ injected into the PC and DBR regions 202 and 203 which includes only a sawtooth wave current 2a having the same repetition frequency and current range as those for the active region 201, so that a sweep of an oscillation wavelength is carried out in the wavelength tunable a laser device 1 by a width of 45 GHz, and the injection of the sawtooth wave current 2a into the wavelength tunable laser device 1 compensates an absorption loss which is induced in the PC and DBR regions 202 and 203 by the injection of the sawtooth wave current 2a thereinto and refrains from the fluctuation of a light output radiated from the wavelength tunable laser device 1. The light output of the wavelength tunable laser device 1 is passed through the isolator 3 and then divided to be propagated through the optical fiber 5A and 15A by the optical divider 4. The light output of the optical fiber 5A is supplied to the Fabry-Perot optical resonator 5, so that the three light outputs of pulses are produced in one period of the sawtooth wave, when an oscillation frequency of the wavelength tunable laser device 1 coincides with the three resonant frequencies of the resonator 5. For three light outputs thus produced are converted in the optical detector 6 to the three electric signals which are then supplied to the terminals 71 of the control unit 7. Simultaneously, the DFB-LDs 8,9 and 10 are driven to radiate light outputs which are passed through the isolators 11, 12 and 13 by the driving means 17, 18 and 19, respectively. The light outputs passed through the isolators 11, 12 and 13 are propagated through the optical fibers 14A, 14B and 14C, and then combined in the first optical coupler 14. The light supplied from the first optical coupler 14 is propagated through the optical fiber 15B, and then combined in the second optical coupler 15 with the light supplied from the optical fiber 15A. The combined lights are propagated through the optical fiber 16A, and then converted in the second detector 16 to electric signals which are supplied to the terminal 72 of the control unit 7.

In the control unit 7, the electric signals of pulses received at the input terminal 71 from the first optical detector 6 are amplified in the low-pass amplifier 401, and then converted in the Schmitt trigger circuit 402 to the logic signals. The polarity of the logic signals is inverted to be applied to the input terminal 404 of the circuit 410. The inverted logic signals are defined as "the first to third reference pulses 404a" as shown in FIG. 7A. The electric signals received at the input terminal 72 from the second optical detector 16 are supplied to the low-pass amplifier 405 in which the beat signals of the three electric pulse signals are produced, when the difference of frequencies between the light output of the wavelength tunable laser device 1 and the light outputs of the DFB-LDs 8,9 and 10 is in the range of ±600 MHz. The three pulses are subject to an envelope detection in the envelope detector 406, and then converted in the Schmitt trigger circuit 407 to the logic signals which are then inverted in the inverter 408. The inverted logic signals are supplied to the input terminal 409 of the circuit 410, and shown to be "the first to third beat signals 409a" in FIG. 7B.

In the circuit 410, the first to third reference pulses 404a are supplied to the decade counter 501, and the first to third beat pulses 409a are supplied through the OR circuit 537 to the decade counter 502. In the decade counter 501, the first square wave 501a is produced at the terminal 1 during the time interval between the first and second reference pulses 404a as shown in FIG. 7C, the second square wave 501b is produced at the terminal 2 during the time interval between the second and third reference pulses 404a as shown in FIG. 7D, and the third square wave 501C is produced at the terminal 3 during the time interval between the third reference pulse 404a and the start of the next sawtooth wave signal 2a as shown in FIG. 7E. In the same manner, the first to third square waves 502a, 502b and 502c are produced at the terminals 1, 2 and 3 in accordance with the first to third beat pulses 409a and the sawtooth wave signal 2a as shown in FIGS. 7C, 7D and 7E. Outputs of the terminals 1 of the decade counters 501 and 502 are supplied to the exclusive OR circuit 503, and those of the terminals 2 and 3 of the decade counters 501 and 502 are supplied to the exclusive OR circuits 504 and 505, respectively. Outputs of those exclusive OR circuits 503, 504 and 505 are produced in the following truth table, and shown in FIG. 7F to 7H by reference numerals 503a, 503b, 504a, 504b and 505a. These outputs are supplied to the pulse selection circuit 506.

| INPUT | | OUTPUT |
|---|---|---|
| 0 | 0 | 0 |
| 0 | 1 | 1 |
| 1 | 0 | 1 |
| 1 | 1 | 0 |

Figure 7I:
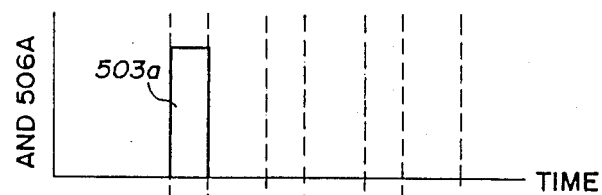
Figure 7J:
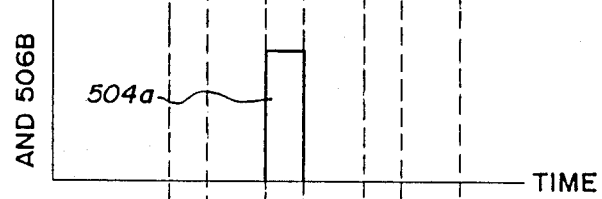
Figure 7K:
Figure 7L:
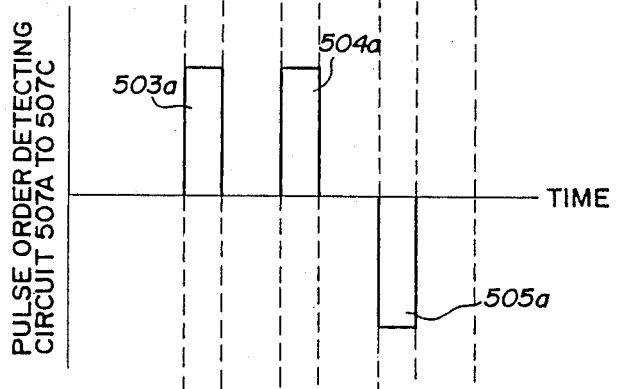
Figure 7M:
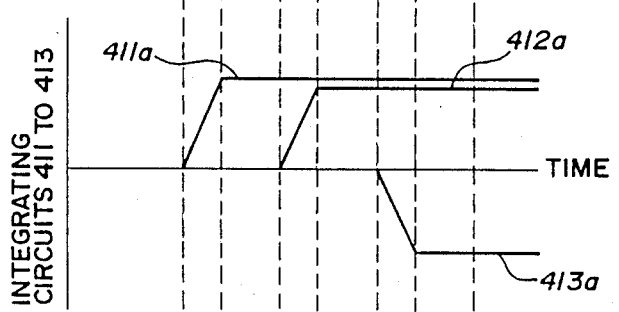

In the first AND circuit 506A, the pulse 503a is passed therethrough, while the pulse 503b is stopped to be passed therethrough as shown in FIG. 7I in accordance with the existence of the pulse 504A. That is, the earlier producing pulse 503a is only passed through the first AND circuit 506A, where the pulses 503a and 503b are supplied thereto. In the same manner, only the pulse 504a is passed through the second AND circuit 506B as shown in FIG. 7J, while the single pulse 505a is passed through the third AND 506C as shown in FIG. 7K. The pulses 503a, 504a and 505a thus passed through the pulse selection circuit 506 are supplied to the first to third pulse order detecting circuits 507A, 507B and 507C. In the first pulse order detecting circuit 507A, the switch 510 is turned on, and the switch 511 is turned off, because the terminals Q and $\overline{Q}$ of the multivibtator 508 are "low" and "high", respectively, and a signal applied to the terminal B is "low", when the pulse 503a is applied to the terminal $C_D$, so that the pulse 503a is supplied through the switch 510 to the integrating circuit 411 as shown in FIG. 7L. When the pulse 503a becomes "low", the first beat pulse 409 is applied to the terminal B of the multi-vibrator 508. This means that a pulse is passed through the pulse order detecting circuit 507A, when the first reference signal 404a is produced earlier than the first beat signal 409a, while a pulse is inverted to be passed therethrough, when the first reference signal 404a is produced later than the first beat signal 409a. In the second pulse order detecting circuit 507B, the pulse 504b is passed therethrough without being inverted, as shown in FIG. 7L, because the square wave signal 502a (as shown in FIG. 7C) becomes "low", when the pulse 504b becomes "low". In the third pulse order detecting circuit 507c, the pulse 505a is inverted to be passed therethrough as shown in FIG. 7L, because the square wave signal 502b is applied to the terminal B of the multi-vibrator 508 before the pulse 505a is applied to the terminal $C_D$, so that the switch 510 is turned off, and the switch 501 is turned off, when the square wave signal 502b becomes "low". The non-inverted pulses 503a and 504a, and the inverted pulse 505a are integrated in the integrating circuits 411 to 413 during each two or three periods of the sawtooth waves 2a, respectively, to provide integrated values 411a, 412a and 413a as shown in FIG. 7M. The integrated values 411a, 412a and 413a are supplied to the driving means 17, 18 and 19, respectively. In the driving means 17, the integrated value 411a is supplied to the terminal 601, so that the operational amplifier 602 controls the driving transistor 604 to drive the DFB-LD8 in accordance with the difference between the integrated value 411a and the reference value obtained from the reference voltage means 603. As a result, the DFB-LD8 is driven by the driving current supplied from the driving transistor 604 which is added to a biased current. This means that the DFB-LD 8, 9 and 10 are controlled to radiate light outputs having a predetermined frequency separation, thereby minimizing the time difference between the aforementioned reference and beat pulses. As clearly understood from the above descriptions, the oscillation frequency separation is stabilized strictly in the same value as a free-spectrum range of the optical resonator among the plural laser devices.

Here, it is assumed that the second beat pulse 409a is caused not to be produced due to a fault in the second DFB-LD 9, for instance, in accordance with the secular variation. In this assumption, the reference pulses 404a are supplied through the OR circuit 540 to the monostable multi-vibrator 531 in the dummy pulse producing circuit 550. The multi-vibrator 531 produces the square waves 531a having the width $T_1$ at the rising time of the reference signals 404a and at the start of the sawtooth wave 2a as shown in FIG. 8A, and the monostable multi-vibrator 532 produces the square pulses 532a having the width $T_2$ at the falling time of the square waves 531a as shown in FIG. 8B. The time duration of the width $T_2$ is defined as "a monitor time" in this embodiment, and varies dependent on the value of the variable resistances $R_1$ and $R_2$. Thus, the AND circuit 533 produces a high signal, when the beat pulse 409a is supplied through the OR circuit 537 to the AND circuit 533 in the monitor time duration $T_2$, so that the monostable multi-vibrator 534 is driven, and an inverted output $\overline{Q}$ of the multi-vibrator 534 becomes "low" as shown by 534a in FIG. 8C. On the other hand, the inverted output $\overline{Q}$ remains "high" as also shown by 534b in FIG. 8C, because the second beat pulse 409a is not supplied to the AND circuit 533. The multi-vibrator 534 is reset by an inverted output $\overline{Q}$ of the monostable multi-vibrator 535, and the inverted output $\overline{Q}$ of the multi-vibrator 534 is supplied to a control terminal $C_D$ of the monostable multi-vibrator 536 which is driven to produce a square wave at the end of the monitor time duration $T_2$ by the output $\overline{Q}$ of the multi-vibrator 532, although the multi-vibrator 536 is not driven to produce the square wave, when it receives a low signal at a control terminal $C_D$. Therefore, the multi-vibrator 536 is not driven to produce the square wave, when the beat pulse 409a is supplied to the dummy pulse producing circuit 550 in the monitor time duration $T_2$, while the multi-vibrator 536 is driven to produce the square wave 536a as shown in FIG. 8D, when the beat pulse 409a is not supplied to the dummy pulse producing circuit 550 in the monitor time duration $T_2$. Thus, the square wave 536a is supplied through the OR circuit 537 to the decade counter 502 in which the square wave 536a is processed as a beat pulse.

Figure 10:
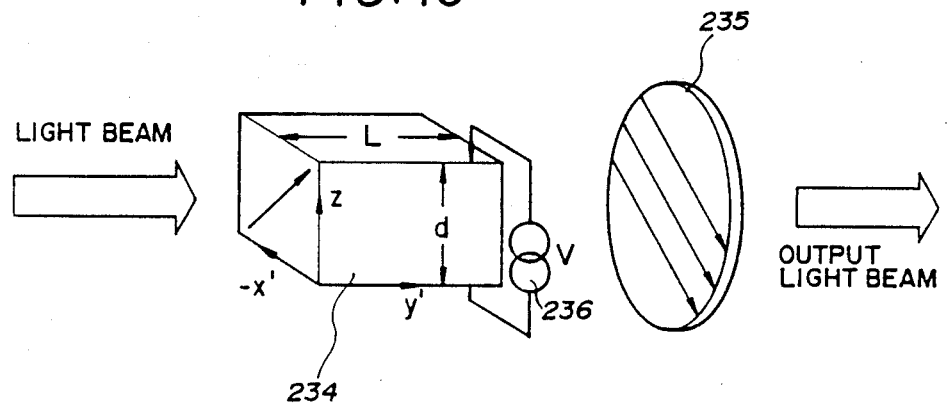
FIG. 10 is an explanatory diagram showing an optical amplitude modulator in the second embodiment.

FIG. 9 shows an apparatus for stabilizing oscillation frequency separation among plural laser devices in a second embodiment according to the invention, wherein like parts are indicated like reference numerals as used in FIG. 1. In the apparatus, light outputs of DFB-LDs 8, 9 and 10 to be controlled in the oscillation frequency separation are modulated with different frequencies $f_1$, $f_2$ and $f_3$. Therefore, the corresponding relation between first to third beat pulses and the DFB-LDs 8, 9 and 10 is clarified by discriminating the modulation frequencies $f_1, f_2$ and $f_3$ in a control unit, because the frequency-modulated beat pulses are supplied to the control unit. Accordingly, the corresponding relation can be exchanged among the DFB-LDs 8, 9 and 10 by exchanging the modulating frequencies $f_1$, $f_2$ and $f_3$ among the DFB-LDs 8, 9 and 10, so that oscillation frequencies of the DFB-LDs 8, 9 and 10 may be exchanged. Here, the difference between the first and second embodiments will be explained. The light outputs of the DFB-LDs 8, 9 and 10 to be controlled in the oscillation frequency separation are passed through optical isolators 11, 12 and 13, respectively, and modulated with modulating frequencies 1 MH$_z$, 2 MH$_z$ and 3 MH$_z$ by optical amplitude modulators 231, 232, 233 each including an optical phase modulator 234 having a length L and a thickness d and a polarizer 235 which are longitudinally arranged as shown in FIG. 10. In the optical phase modulator 234 and the polarizer 235, the directions of polarized lights are orthogonal to each other as indicated by arrows, and a predetermined voltage is applied from a power source 236 to the optical phase modulator 234. Such an optical amplitude modulator has been described in detail in Chapter 9 of "Introduction to optical electronics", 1971, authored by Amnon Yariv which is published from Holt, Rinehart and Winston Inc.

Figure 11:
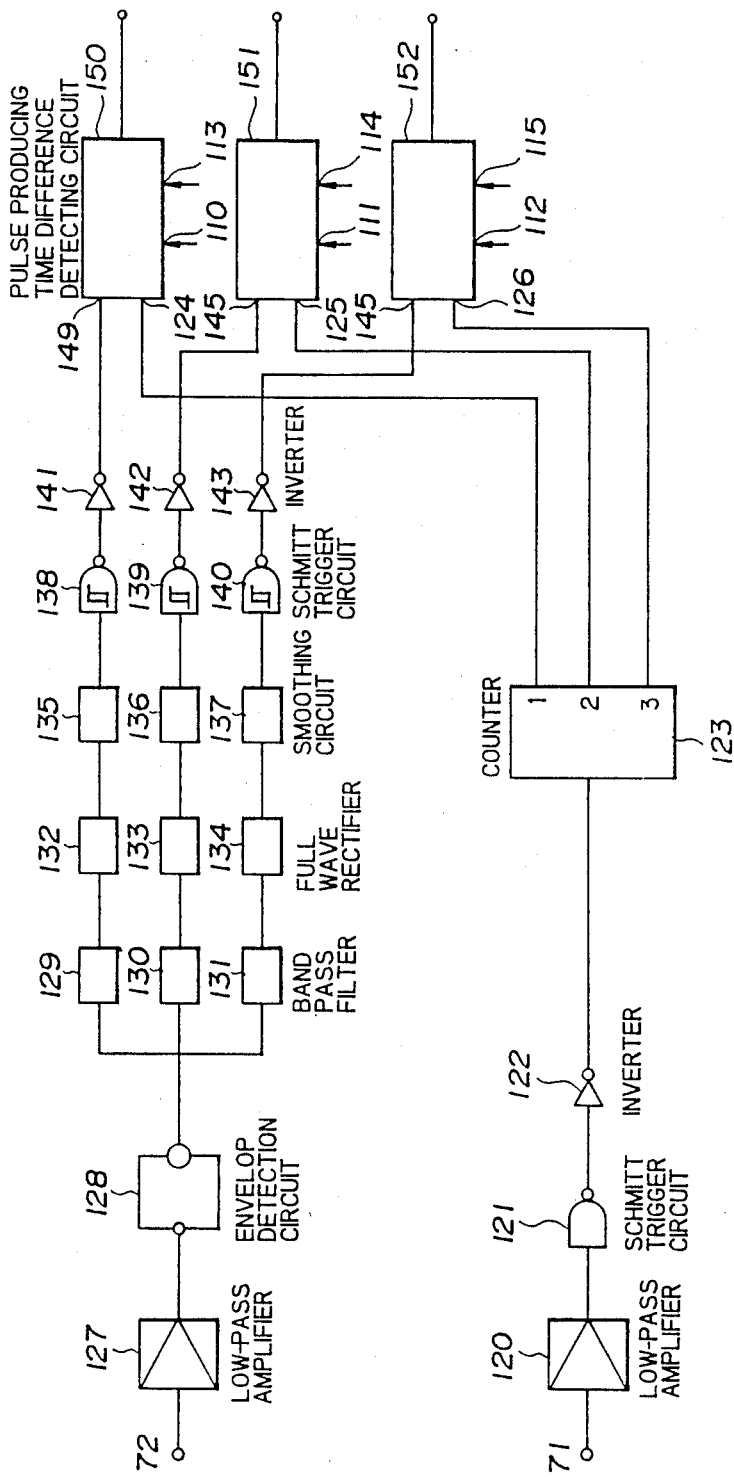
FIG. 11 is a block diagram showing a control unit in the second embodiment.
Figure 13A:
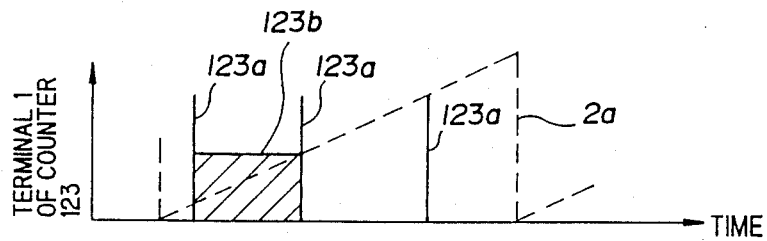
Figure 13B:
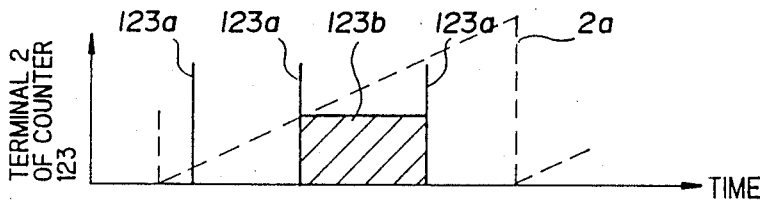
Figure 13C:
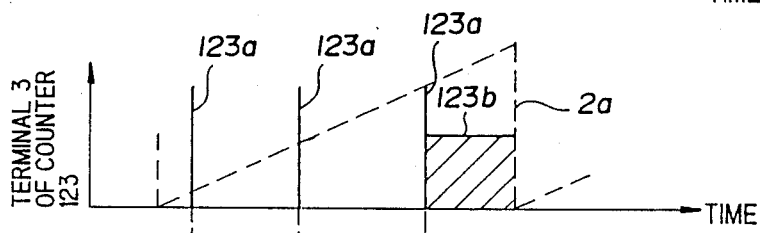

FIG. 11 shows the control unit 7 as shown in FIG. 9. In the control unit 7, an electric signal is supplied through a second input terminal 72 to a low-pass amplifier 127 having a cut-off frequency of 600 MH$_z$ in which a low-pass filtering is carried out, and a train of electric pulse signals are produced, where a frequency difference between a light output of a wavelength tunable laser device 1 and a combined light output of the DFB-LDs 8, 9 and 10 is in a range of ±600 MH$_z$. The number of the pulse signals is three as explained in the first embodiment. The three pulse signals are also defined as first to third beat pulses in this embodiment. The three beat pulses are envelop-detected in an envelop detection circuit 128, and divided into three signals which are then supplied to band-pass filters 129, 130 and 131 having a band-pass width of 100 KH$_z$ and center frequencies 1 MH$_z$, 2 HM$_z$ and 3 MH$_z$, respectively. The three divided signals are further passed through full-wave rectifiers 132, 133 and 134, and smoothing circuits 135, 136 and 137, respectively, so that pulse signals having no internal structure are obtained. The pulse signals become square waves having an amplitude equal to a logic level in Schmitt trigger circuits 138, 139 and 140, respectively, and then inverted pulse signals are supplied to input terminals 144, 145 and 146 of pulse generation time difference detecting circuits 150, 151 and 152. On the other hand, an electric pulse signal from a first optical detector 6 is supplied to a first input terminal 71 of the control unit 7 in which the pulse signal is amplified in a low-pass amplifier 120, and then processed to have an amplitude equal to a logic level in a Schmitt trigger circuit 121. Thereafter the pulse signal is inverted in an inverter 122, and the inverted pulse signal including the first to third reference signals 123a is supplied to a counter 123 in which square waves 123b are produced in accordance with the reference signals 123a and a sawtooth wave 2a produced in a sawtooth wave generator 2 as shown in FIGS. 13A to 13C in the same manner as in FIGS. 7C to 7E. The first square wave 123b (FIG. 13A) is supplied from a first terminal 1 of the counter 123 to an input terminal 124 of the pulse producing time difference detecting circuit 150, the second square wave 123b (FIG. 13B) is supplied from a second terminal 2 of the counter 123 to an input terminal 125 of the pulse generation time difference detecting circuit 151, and the third square wave 123b (FIG. 13C) is supplied from a third terminal 3 of the counter 123 to an input terminal 126 of the pulse generation time difference detecting circuit 152.

Figure 12:
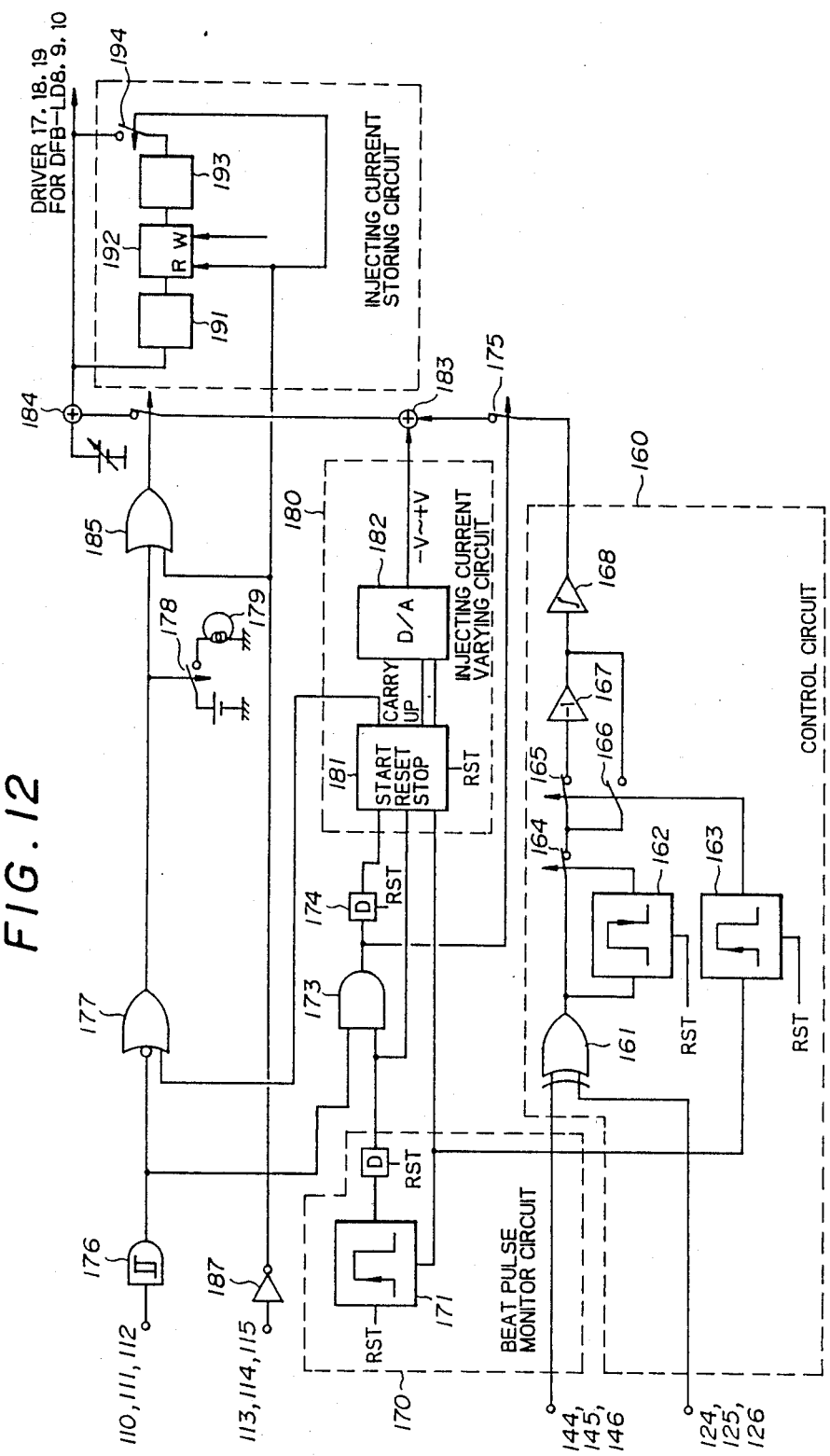
FIG. 12 is a block diagram showing a circuit for detecting the difference of pulse producing times.
Figure 13D:
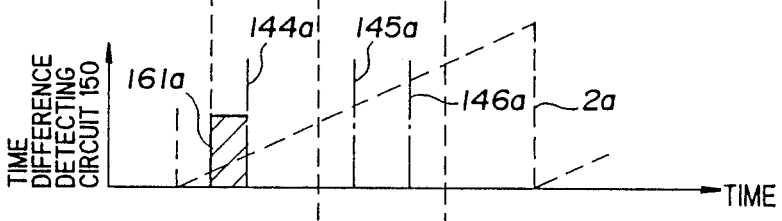
Figure 13E:
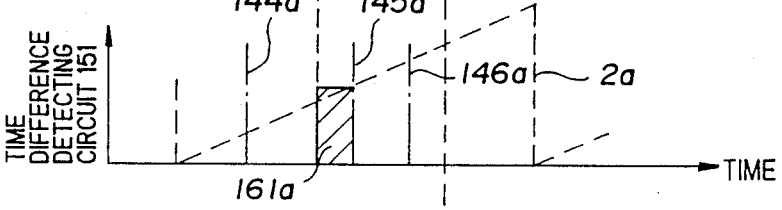
Figure 13F:
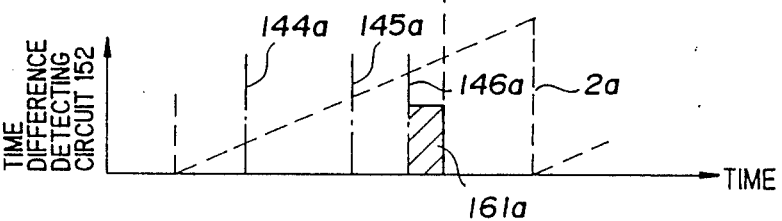

FIG. 12 shows the pulse generation time difference detecting circuits 150, 151 and 152. The first square wave 123b and the first beat signal 144a are supplied to an exclusive OR circuit 161 included in a control circuit 160 of the pulse generation time difference detecting circuit 150, and the second and third square waves 123b and the second and third beat signals 145a and 146a are supplied to exclusive OR circuits 161 of the pulse generation time difference detecting circuits 151 and 152, respectively. Thus, first to third square waves 161a are produced in the pulse generation time difference detecting circuits 150, 151 and 152, respectively, as shown in FIGS. 13D to 13F. At the rear stage of the exclusive OR circuit 161, a pulse order detecting circuit including monostable multi-vibrators 162 and 163, switchs 164 to 166, and a polarity reversing circuit 167 is provided to change or maintain the polarity of an output signal of the exclusive OR circuit 161 in accordance with the pulse order between the reference and beat signals to be compared with each other as described in the first embodiment. The output signal of the pulse order detecting circuit is integrated in an integrating circuit 168 to provide a driving signal for a corresponding one of the DFB-LDs 8, 9 and 10.

Here, it is assumed that at least one of the wavelength tunable laser device 1 and the DFB-LDs 8, 9 and 10 is involved in a fault. In FIG. 20, a light output power detecting circuit 100 including optical detectors 101, 102, 103 and 104 is provided to monitor light output powers of the wavelength tunable laser device 1 and the DFB-LDs 8, 9 and 10. In each of the pulse generation time difference detecting circuits 150, 151 and 152, a beat pulse monitor circuit 161 including a monostable multi-vibrator 171 and a D flip flop 172 is provided to detect whether or not beat pulses are ordinarily produced in one frequency sweep period, and an injecting current varying circuit 180 including a binary counter 181 and a digital to analog converter 182 is provided to increase output signals of the DFB-LDs 8, 9 and 10 in a step manner at each frequency sweep period in accordance with an external start signal, and stop the increase of the output signal in accordance with an external stop signal, thereby holding the output signal at a time of the stop. Further, an injecting current storing circuit 190 including an analog to digital converter 191, a memory 192, a digital to analog converter 193 and a switch 194 is provided to store injecting currents for the DFB-LD 8, 9 and 10 in the memory 192, renew the stored data at the end of each frequency sweep period, and supply data read from the memory 192 in accordance with an external input signal.

In addition to the aforementioned assumption, an oscillation frequency of the DFB-LD 9 is assumed to be deviated from the range of the frequency sweep in the wavelength tunable laser device 1, so that a corresponding beat pulse is not produced, although the oscillation still continues in the DFB-LD 9. In this case, a light output radiated from the rear plane of the DFB-LD 9 is detected by the optical detector 62 in which a converted electric signal is produced to be supplied to terminals 110, 111 and 112 of the control unit 7. Where the electric signal becomes zero, it is determined that the oscillation of the DFB-LD 9 is stopped.

In this case, whether or not the beat pulse is produced is detected in the beat pulse monitor circuit 170. In more detail, the monostable multi-vibrator 705 produces a square pulse rising at the start of each frequency sweep period as indicated by "RST", and to be reset at the rising time of a coming beat pulse. Where the multi-vibrator 705 is not reset without the input of the beat pulse, the output width of the multi-vibrator 705 is set to be longer than the frequency sweep period by a CR constant externally provided. In FIG. 14A, a sawtooth wave 2a for the frequency sweep and the beat pulse 145a for the DFB-LD 9 are shown, and the output 171a of the multi-vibrator 171 is reset by the beat pulse 145a, and becomes longer than the sawtooth wave 2a, where no beat pulse is produced as shown in FIG. 14B. At the start of a following frequency sweep period, the output of the D flip flop 172 becomes high, because the multi-vibrator 171 is not reset due to the lack of the beat pulse as shown in FIG. 14C. As a result, an AND gate 173 is turned on, so that the binary counter 181 is reset at the rising time of the D flip flop 172, and begins counting in accordance with an output of a D flop flop 174 at the start of the next frequency sweep period (RST) as shown in FIG. 14D. At this stage, the binary counter 181 counts up in each frequency sweep period (in other words, each time the RST is produced) by one. An output of the binary counter 181 is converted in the digital to analog converter 182 to an analog signal as shown in FIG. 14E, the converted analog signal is supplied through adders 183 and 184 to the DFB-LD 9. In this case, the output of the converter 182 is biased to range from $-V$ to $+V$ in voltage, wherein the voltage $+V$ is set to correspond to a minimum oscillation injecting current threshold value of the DFB-LD 8, 9 and 10. As shown in FIG. 14E, the injection current is increased dependent on the counted value, so that the oscillation frequency of the DFB-LD 9 is in the range of the frequency sweep in the wavelength tunable laser device 1. As a result, a beat pulse 145b corresponding to the DFB-LD 9 is produced as shown in FIG. 14A, so that the binary counter 181 stops counting and holds a counted value at the rising time of the beat pulse 145b as shown in FIG. 14E. When it is detected that a beat pulse is not produced, an analog switch 175 is turned off by the output of the AND gate 173, so that a feedback line for the ordinary oscillation frequency separation control becomes open.

Next, it is assumed that at least one of the DFB-LDs 8, 9 and 10 is involved in a fault in which the oscillation stops. In this case, an input signal supplied to at least one of the terminal 110, 111 and 112 of the control unit 7 becomes low, so that an output of a NOR gate 711 becomes high by receiving the input signal from a Schmitt trigger circuit 176. As a result, an analog switch 178 is turned on to turn a pilot lump 179 indicating a fault of at least one of the DFB-LDs 8, 9 and 10 on. The output of the NOR gate 177 is supplied through an OR gate 185 to an analog switch 186 which is thereby turned off, so that the aforementioned feedback line becomes open. This control operation is applied to the case where the deviated oscillation frequency of at least one of the DFB-LDs 8, 9 and 10 can not get back to the range of the frequency sweep, even if an injected current is increased up to the maximum value in accordance with a counted value of the binary counter 181. In this case, the at least one of the DFB-LDs 8, 9 and 10 is considered to be a laser device which is impossible to be used.

Finally, it is assumed that the wavelength tunable laser device 1 is involved in a fault in which the laser device 1 stops oscillating, so that an output of the optical detector 104 which receives a light output radiated from the rear plane of the laser device 1 becomes zero. The output is supplied through a Schmitt trigger circuit 105 to an analog switch 106 which is thereby turned off, so that an injection current for the laser device 1 becomes zero. Therefore, the oscillation frequency separation control is no longer carried out, until the wavelength tunable laser device 1 is replaced by a new wavelength tunable laser device. At this stage, a following control is carried out to continue the oscillations of the DFB-LDs 8, 9 and 10 in the state that the oscillation frequency separation is held under the conditions of the time when the laser device 1 stops the oscillation. That is, the monitor result of an output power of the wavelength tunable laser device 1 is supplied to input terminals 113, 114, 115 of the pulse generation time difference detecting circuits 150, 151 and 152 in the control unit 7. When the output power is zero, an output of an inverter 187 becomes high to provide a high signal at an output terminal of the OR gate 185, so that the analog switch 186 is turned off. As a result, the aforementioned feedback line for the DFB-LDs 8, 9 and 10 becomes open. On the other hand, the injection currents for the DFB-LDs 8, 9 and 10 are converted to digital signals in the analog to digital converter 191, and then stored in the memory 192. The stored data are read from the memory 192, when the output power of the wavelength tunable laser device 1 becomes zero as described above. Simultaneously, the analog switch 194 is turned on, and the read data are supplied through the switch 194 to the driver 17, 18 and 19 for the DFB-LDs 8, 9 and 10, after being converted to analog signals in the digital to analog converter 193. In the ordinary oscillation frequency separation control, contents stored in the memory 192 are renewed in each frequency sweep period. In the modification of the second embodiment, the band-pass filter may be replaced by a circuit in which a product is obtained between the output of the optical detector 16 and each modulating signal to carry out the synchronous detection.

As clearly understood from the first and second embodiments, the occurrence of the beat pulses is monitored in a predetermined time duration before and after each reference signal. In the control of stabilizing the oscillation frequency separation, where the beat pulse is not supplied to the control unit in the predetermined time duration, a dummy pulse is produced as a beat pulse in the control unit before a following reference signal is produced, and the dummy pulse is inserted into a train of the beat pulses. In accordance with this operation, the normal control sequence continues in the presence of the dummy pulse, even if a beat pulse is not produced due to a fault in at least one of the laser devices to be controlled in the oscillation frequency separation.

In the invention, beat pulses obtained by the combination of a reference light output and plural light outputs of plural laser device to be controlled are of modulation signals, because the plural light outputs are modulated with different frequencies, respectively. In a control unit, it is possible that the beat pulses are related to the respective laser devices without counting the number of the beat pulses by discriminating the modulating frequencies applied to the beat pulses in the use of outputs supplied from a band-pass filter. Therefore, it is easy in the invention to restore the original occurrance order of the beat pulses, even if the order is different in the beat pulses from the original one in the control operation.

However, this is difficult to be carried out in the conventional methods for stabilizing oscillation frequency separation among plural laser devices. As explained before, where at least one of the beat pulses is not produced due to faults in at least of the laser devices, the remaining laser devices which are not under the state of a fault remain controlled in the invention by the produced beat pulses. In this circumstance, the laser device corresponding to the beat pulses which are not produced due to the fault is monitored to check an output power, so that the cease of the oscillation is detected in the non-presence of the output power, and the deviation of an oscillation frequency is detected in the presence of the output light power. In the former case, the current injection into the laser device of the fault is controlled to stop, and it is replaced by a new laser device. In the latter case, whether or not an oscillation frequency of the laser device of the fault is restored to the original oscillation frequency is determined in accordance with the restoration or non restoration of a beat pulse by varying the injected current in a wide range. In this case, if the beat pulse is not produced despite the wide range variation of the injected current, the laser device of the fault is replaced by a new laser device in the same manner as the former case.

On the other hand, the output light power of a reference laser device is monitored any time, and the cease of the oscillation is detected, where the output light power is zero. In this case, injecting a current is controlled to stop, and currents which were injected into the laser devices to be controlled in the oscillation frequency separation prior to the cease of the oscillation in the reference laser device are stored in a memory. The injection of the stored currents continues into the laser devices to be controlled, so that the oscillation frequency separation is maintained for a short time duration. This allows the operation of the laser devices to be controlled for the limited time. As explained above, even if any fault occurs among the reference device and the laser devices to be controlled, the normal operation state is restored maintaining the operation of a total system.

Although the invention has been described with respect to specific embodiment for complete and clear disclosure, the appended claims are not to be thus limited but are to be construed as embodying all modification and alternative constructions that may occur to one skilled in the art which fairly fall within the basic teaching herein set forth.

What is claimed is:

1. A method for stabilizing oscillation frequency separation among plural laser devices, comprising:
sweeping the oscillation frequency of a reference semiconductor laser device to which an external signal is applied to radiate a light output whose oscillation frequency varies over a range of frequencies;
driving plural semiconductor laser devices to radiate light outputs each at an oscillation frequency in the frequency range of said oscillation frequency sweep of light output from said reference semiconductor laser;
combining the frequency swept light output from said reference semiconductor laser and said light outputs from said plural semiconductor laser devices to produce combined light signals which are then converted to electric signals, a low frequency component of said electric signals being filtered to produce a train of beat pulses corresponding to said oscillation frequencies of said plural semiconductor laser devices;

passing a part of the frequency swept light output from said reference semiconductor laser through an optical resonator having periodic resonant frequencies to produce reference light outputs at said periodic resonant frequencies which are then converted to electric reference pulses, the interval between said periodic resonant frequencies being equal to a predetermined oscillation frequency separation among said plural semiconductor laser devices;

comparing occurrence times of said beat pulses and those of said reference pulses to produce error signals corresponding to the time difference therebetween;

controlling the oscillation frequencies of said plural semiconductor laser devices such that said error signals are approximately equal to a predetermined value;

monitoring the occurrence of each beat pulse of said beat pulses in a predetermined time duration before and after the occurrence of said reference pulses; and producing a dummy beat pulse at the end of said predetermined time duration where no beat pulse is detected in said monitoring of said occurrance of said each beat pulse, said dummy beat pulse being compared with a corresponding reference pulse of said reference pulses to produce said error signal.

2. An apparatus for stabilizing oscillation frequency separation among plural laser devices, comprising:
a reference semiconductor laser device to which an oscillation frequency sweep signal is applied over a range of frequencies;
plural semiconductor laser devices radiating light outputs each at an oscillation frequency in the frequency range of said oscillation frequency sweep of light output from said reference semiconductor laser device;
an optical divider for dividing the light output of said reference semiconductor laser device into at least two light outputs;
a first optical coupler for combining light outputs from said plural laser device;
a second optical coupler from combining one of said at least two light outputs and the light outputs combined in said first optical coupler;
an optical resonator through which the other one of said at least two light outputs is passed to produce transmission light outputs whose intensity levels correspond to resonant frequency peaks, so that reference light outputs are supplied therefrom;
means for converting said reference light outputs to electric reference pulses;
means for converting the combined output light obtained in said second optical coupler to an electric signal;
a low-pass filter through which a low frequency component of said electric signal is passed to produce beat pulses corresponding to said oscillation frequencies of said plural laser devices;
means for producing error signals in accordance with the difference of the occurrence times between said reference pulses and said beat pulses;
means for controlling said plural laser devices to be driven in accordance with said error signals, such that said error signals become a predetermined value;
a beat pulse monitoring circuit for monitoring the occurrence of each beat pulse of said beat pulses in a predetermined time duration before and after the occurrence of said reference pulses; and
a dummy beat pulse producing circuit for producing a dummy beat pulse at the end of said predetermined time duration where no beat pulse is detected by said beat pulse monitoring circuit;
wherein said means for controlling controls said means for producing to produce said error signal in accordance with the comparison between said dummy beat pulse and a corresponding reference pulse of said reference pulses.

3. An apparatus for stabilizing oscillation frequency separation among plural laser devices, comprising:
a reference semiconductor laser device to which an oscillation frequency sweep signal is applied over a range of frequencies;
plural semiconductor laser devices radiating light outputs each at an oscillation frequency in the frequency range of said oscillation frequency sweep of light output from said reference semiconductor laser device;
an optical divider for dividing the light output of said reference semiconductor laser device into at least two light outputs;
plural optical modulators for modulating the light outputs from said plural laser devices with different modulating frequencies;
a first optical coupler for combining the modulated light outputs from said plural optical modulator;
a second optical coupler for combining one of said at least two light outputs and the modulated light outputs combined in said first optical coupler;
an optical resonator through which the other one of said at least two light outputs is passed to produce transmission light outputs whose intensity level correspond to resonant frequency peaks, so that reference light outputs are supplied therefrom;
means for converting the combined output light obtained in said second optical coupler to an electric signal;
a low-pass filter through which a low frequency component of said electric signal is passed to produce beat pulses corresponding to said oscillation frequencies of said plural laser devices;
means for producing error signals in accordance with the difference of the occurrence times between said reference pulses and said beat pulses;
means for monitoring light output powers of said reference semiconductor laser device and said plural laser devices;
a beat pulse monitoring circuit for receiving the combined light output of said second optical coupler and monitoring whether or not beat pulses corresponding to the different modulating frequencies are detected in said combined light output;
means for varying an injecting current for at least one laser device of said plural laser devices in a predetermined current range, where the light output power of said at least one laser device is monitored to be greater than a first predetermined power value, and a beat pulse corresponding to said at least one laser device is not detected by said beat pulse monitoring circuit;

means for shutting off an injection current for at least one laser device of said plural laser devices, where the light output power of said at least one laser device is monitored to be less than a second predetermined power value, and a beat pulse corresponding to said at least one laser device is not detected by said beat pulse monitoring circuit, despite the variation of the injection current in the predetermined current range; and means for controlling said plural laser devices to be driven in accordance with said error signals, such that said error signals become a predetermined value, where the light output powers of said plural laser devices are all greater than the first predetermined power value, and the beat pulses corresponding to the different modulating frequencies are all detected, and controlling said plural laser devices to be driven with injection currents which are equal to values at the final moment at which said reference semiconductor laser device is driven to radiate a light output power greater than a third predetermined power value, where the light output power of said reference semiconductor laser device becomes the third predetermined power value.

* * * * *